(12) United States Patent
Jahnes et al.

(10) Patent No.: US 8,739,096 B2
(45) Date of Patent: May 27, 2014

(54) MICRO-ELECTRO-MECHANICAL STRUCTURE (MEMS) CAPACITOR DEVICES, CAPACITOR TRIMMING THEREOF AND DESIGN STRUCTURES

(75) Inventors: Christopher V. Jahnes, Upper Saddle River, NJ (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 13/326,409

(22) Filed: Dec. 15, 2011

(65) Prior Publication Data
US 2013/0154054 A1 Jun. 20, 2013

(51) Int. Cl.
*G06F 17/50* (2006.01)
*H01L 29/02* (2006.01)

(52) U.S. Cl.
USPC ........... 716/112; 716/100; 716/118; 716/119; 257/532

(58) Field of Classification Search
CPC ............... B81B 2201/0221; B81B 3/0064; H01G 5/109
USPC ............. 716/55, 100, 118, 119, 112; 257/532
See application file for complete search history.

(56) References Cited

U.S. PATENT DOCUMENTS

| | | | |
|---|---|---|---|
| 5,880,920 A * | 3/1999 | Fischer et al. | 361/187 |
| 5,943,550 A | 8/1999 | Fulford, Jr. et al. | |
| 5,959,516 A * | 9/1999 | Chang et al. | 334/14 |
| 6,094,102 A * | 7/2000 | Chang et al. | 331/17 |
| 6,180,976 B1 * | 1/2001 | Roy | 257/306 |
| 6,232,847 B1 * | 5/2001 | Marcy | 331/167 |
| 6,365,422 B1 | 4/2002 | Hewett et al. | |
| 6,403,285 B1 | 6/2002 | Holscher et al. | |
| 6,912,037 B2 * | 6/2005 | Deane | 349/187 |
| 6,953,696 B2 | 10/2005 | Yamauchi | |
| 7,299,105 B2 | 11/2007 | Holfeld et al. | |
| 7,616,077 B1 | 11/2009 | Wittwer et al. | |
| 7,962,234 B2 | 6/2011 | Song et al. | |
| 7,966,087 B2 | 6/2011 | Kokotov et al. | |
| 2005/0227428 A1 | 10/2005 | Mihai et al. | |
| 2006/0038576 A1 * | 2/2006 | Tadayon | 324/761 |
| 2009/0002914 A1 | 1/2009 | Huff et al. | |
| 2009/0059465 A1 * | 3/2009 | Liu | 361/292 |
| 2009/0189481 A1 | 7/2009 | Kaajakari | |
| 2010/0263445 A1 | 10/2010 | Hayner et al. | |
| 2011/0241135 A1 * | 10/2011 | Kurui et al. | 257/415 |

FOREIGN PATENT DOCUMENTS

JP 2010156574 A 7/2010
WO 0050337 A1 8/2000

OTHER PUBLICATIONS

Gavin K. Ho "Micromechanical IBARs: Modeling and Process Compensation", Journal of Microelectromechanical Systems, vol. 19, No. 3, Jun. 2010, pp. 516-525.

* cited by examiner

*Primary Examiner* — Sun Lin
(74) *Attorney, Agent, or Firm* — Anthony Canale; Roberts Mlotkowski Safran & Cole, P.C.

(57) ABSTRACT

Micro-electro-mechanical structure (MEMS) capacitor devices, capacitor trimming for MEMS capacitor devices, and design structures are disclosed. The method includes identifying a process variation related to a formation of micro-electro-mechanical structure (MEMS) capacitor devices across a substrate. The method further includes providing design offsets or process offsets in electrode areas of the MEMS capacitor devices across the substrate, based on the identified process variation.

23 Claims, 7 Drawing Sheets

US 8,739,096 B2

MICRO-ELECTRO-MECHANICAL STRUCTURE (MEMS) CAPACITOR DEVICES, CAPACITOR TRIMMING THEREOF AND DESIGN STRUCTURES

FIELD OF THE INVENTION

The invention relates to semiconductor structures and, more particularly, to micro-electro-mechanical structure (MEMS) capacitor devices, capacitor trimming for MEMS capacitor devices, and design structures.

BACKGROUND

Capacitors are electronic components used for storing charge and energy. In their simplest form, capacitors comprise two conducting plates separated by an insulating material, e.g., a dielectric material. Capacitors can be formed using micro-electro-mechanical structures, e.g., MEMS capacitor devices. In these types of devices, the capacitor values can vary depending on the position of a beam structure, e.g., space between a moveable actuator and a fixed actuator, as well as an amount and type of insulator material used between these structures. For example, in these types of devices, one or both of the beam structure and the fixed actuator can be covered with an insulator material in order to provide a desired capacitance value.

As with many processes for forming microelectronic devices, process variations can affect the formation of the devices such that variances can be formed amongst identical devices within a wafer, a reticle field and even in a single chip. In MEMS capacitor devices, for example, capacitance variability can result which limits yield or requires large tolerances which limits usefulness of the devices. For example, MEMS lower cavity height varies radially across the wafer, due to systematic chemical mechanical polishing (CMP) variation. This lower cavity height variation causes pull-in voltage variability, which causes MEMS delta capacitance variability. To compensate for the process variations, current MEMS capacitors are screened and partitioned based on their off/on capacitance. Devices with poor tolerance are generally scrapped which significantly reduces overall wafer yield.

Accordingly, there exists a need in the art to overcome the deficiencies and limitations described hereinabove.

SUMMARY

In a first aspect of the invention, a method comprises identifying a process variation related to a formation of micro-electro-mechanical structure (MEMS) capacitor devices across a substrate. The method further comprises providing design offsets or process offsets in electrode areas of the MEMS capacitor devices across the substrate, based on the identified process variation.

In another aspect of the invention, a method comprises identifying a first amount of systematic capacitance variation from a target capacitance value for a plurality of first capacitors on a substrate. The method further comprises modifying a feature of at least some of the first capacitors to adjust a capacitance value at different locations on the substrate.

In another aspect of the invention, a structure comprises a first set of micro-electro-mechanical structure (MEMS) capacitor devices having a first adjusted capacitance value based on identified process variations at a first location on a substrate. The structure further comprises a second set of a MEMS capacitor devices having a second adjusted capacitance value based on identified process variations at a second location on the substrate. The first adjusted capacitance value and the second adjusted capacitance value are different as a result of a physical characteristic feature of the first and second sets of MEMS capacitor devices.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MEMS capacitor devices, which comprises the structures of the present invention. In still further embodiments, a method in a computer-aided design system is provided for generating a functional design model of the MEMS capacitor devices. The method comprises generating a functional representation of the structural elements of the MEMS capacitor devices.

More specifically, in embodiments, a method is provided in a computer-aided design system for generating a functional design model of a MEMS capacitor device. The method comprises: generating a functional representation of a first set of micro-electro-mechanical structure (MEMS) capacitor devices having a first adjusted capacitance value based on process variations at a first location on a substrate; and generating a functional representation of a second set of a MEMS capacitor devices having a second adjusted capacitance value based on process variations at a second location on the substrate. The first adjusted capacitance value and the second adjusted capacitance value are different as a result of a physical characteristic feature of the first and second sets of MEMS capacitor devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

DETAILED DESCRIPTION

Figure 1:
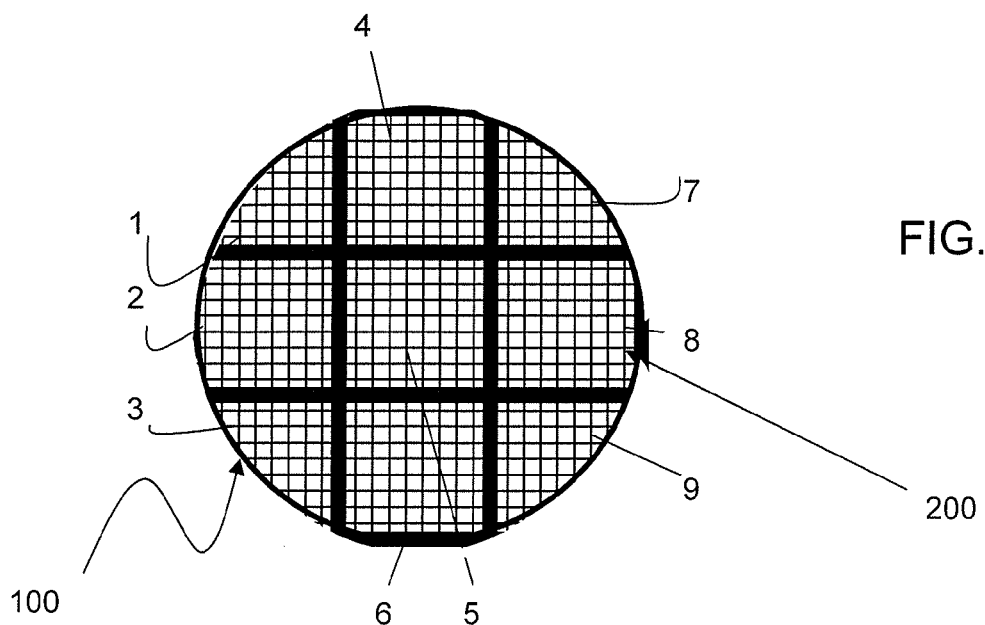
FIG. 1 shows a schematic view of a wafer with a plurality of reticle fields in accordance with aspects of the present invention.

The invention relates to semiconductor structures and, more particularly, to micro-electro-mechanical structure (MEMS) capacitor devices, capacitor trimming for MEMS capacitor devices, and design structures. More specifically, the present invention provides trimmed and/or modified MEMS capacitor devices, which compensate for process variations across a chip, reticle field and/or wafer. A chip contains multiple MEMS capacitors, a reticle field contains multiple chips and a wafer contains multiple reticle fields.

In embodiments, the present invention contemplates printing narrower or wider wires across the wafer, as well as designing the mask with larger or smaller wires across the reticle (where the reticle contains multiple chips) or across the chip (where the chip contains multiple capacitors). For example, in embodiments, the processes of the present invention identify systematic sources of MEMS capacitor variability, e.g., due, for example, to chemical mechanical polishing, film stress, or film deposition thickness variability processes, and applies process and/or mask corrections to adjust the MEMS capacitor electrode contact area and/or MEMS beam volume (physical feature), of the MEMS capacitor device. The adjustment of the physical feature and/or location of the fixed actuator will result in a modified MEMS capacitor capacitance value based on the process variations identified by the present invention. In this way, it is now possible to decrease device variability and increase device yield by providing target capacitance values across the chip, reticle field and/or wafer, regardless of process variations at different locations across the chip, reticle field and/or wafer.

In embodiments, the processes of the present invention identify the process variations across a chip, reticle field and/or wafer using historical information. The historical information can be, for example, stored in a database or other storage device. The identified process variations can be compared to known or target capacitance values, stored in the database. In embodiments, for example, the processes of the present invention can determine a first amount of systematic capacitance variation from a target capacitance value, and using this information, provide a modification to adjust for such capacitance variation across a chip, reticle field and/or wafer. That is, once comparisons are completed, the present invention can provide for process and/or design offsets to adjust capacitance values (achieve target values).

In embodiments, the present invention utilizes photolithographic techniques to adjust (e.g., modify or change) the physical features and/or location of a fixed capacitor electrode or actuator of a MEMS capacitor device across a chip and/or a wafer and/or reticle field. For example, within a chip, the present invention will identify the difference of a capacitance at an edge array (e.g., lower capacitance) and a center array (e.g., higher capacitance) due to systematic process variation at the edge of the chip. Once these variations are identified, the present invention can adjust, for example, an array edge capacitance of the MEMS capacitor device by, for example, providing a design offset in the mask for the fixed wiring level.

Similarly, with regard to a reticle, the present invention will identify the difference in the reticle edge capacitance (e.g., higher capacitance) and the reticle center capacitance (e.g., lower capacitance) due to systematic process variation at the reticle field. Once these variations are identified, the present invention can adjust, for example, the reticle edge capacitance by providing a design offset in the mask. As to wafer variation, the present invention can identify the difference in radial capacitance variation due to systematic process variation. In this scenario, the present invention can adjust the capacitance values by process offsets, for example.

FIG. 1 shows a schematic view of a wafer with a plurality of reticle fields in accordance with aspects of the present invention. More specifically, FIG. 1 shows a schematic view of a wafer 100 with a plurality of reticle fields 1, 2 . . . 9, each of which include a plurality of chips 200. The reticle fields 1, 2 . . . 9 can be, for example, about 30 mm by 30 mm in size; although other dimensions are also contemplated by the present invention. Note that there could also be partial reticle fields, i.e., reticle fields that have some of the reticle field falling outside or off of the wafer. In one illustrative, non-limiting example, each of the chips 200 within each of the reticle fields 1,2 . . . 9 can be about 3 mm by 3 mm in size; although other dimensions are also contemplated by the present invention. In embodiments, FIG. 1 shows nine (9) reticle fields, each with 81 chips 200; however, it should be understood that the wafer 100 shown in FIG. 1 is merely an illustrative example, and that any number of reticle fields and number of chips are contemplated by the present invention.

As should be understood by those of skill in the art, each of the chips 200 can include any type of active or passive devices. For example, in embodiments, the chips can include MEMS capacitor devices, fabricated using conventional photolithographic processes. For example, the MEMS capacitor devices can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS capacitor devices are built on wafers and are realized in thin films of materials patterned by photophotolithographic processes on the top of the wafer 100. In particular, the fabrication of MEMS capacitor devices uses three basic building blocks: (i) deposition of thin films of material on a substrate, (ii) applying a patterned mask on top of the films by photolithographic imaging, and (iii) etching the films selectively to the mask 100.

Although the present invention is primarily directed to MEMS cantilever devices, the methods and structures described in the present invention also apply to any suspended beam MEMS device, such as bridge beams, resonators, filters, etc., and is not limited to MEMS capacitors. For example, the methods and structures of the present invention could apply to MEMS contact switches, bulk acoustic wave resonators, MEMS motion detectors, MEMS gyroscopes, etc.

In MEMS cantilever type devices the fixed electrodes and suspended electrodes are typically manufactured using a series of conventional photolithographic, etching and deposition processes. However, due to process variations, the capacitance of the MEMS capacitor devices can vary depending on the location within the wafer, the reticle field, or even the chip. Note that the variability described below is for illustrative purposes only. More specifically, for example, due to process variations:

(i) the capacitance value of the MEMS capacitor devices can be lower at an edge of a chip than at a center of the chip;

(ii) the capacitance value of the MEMS capacitor devices can be higher at an edge of the reticle field than at a center of the reticle field; and (iii) the capacitance value of the MEMS capacitor devices can be higher at an edge and center of a wafer than at a mid portion of the wafer, as measured radially.

Figure 2:
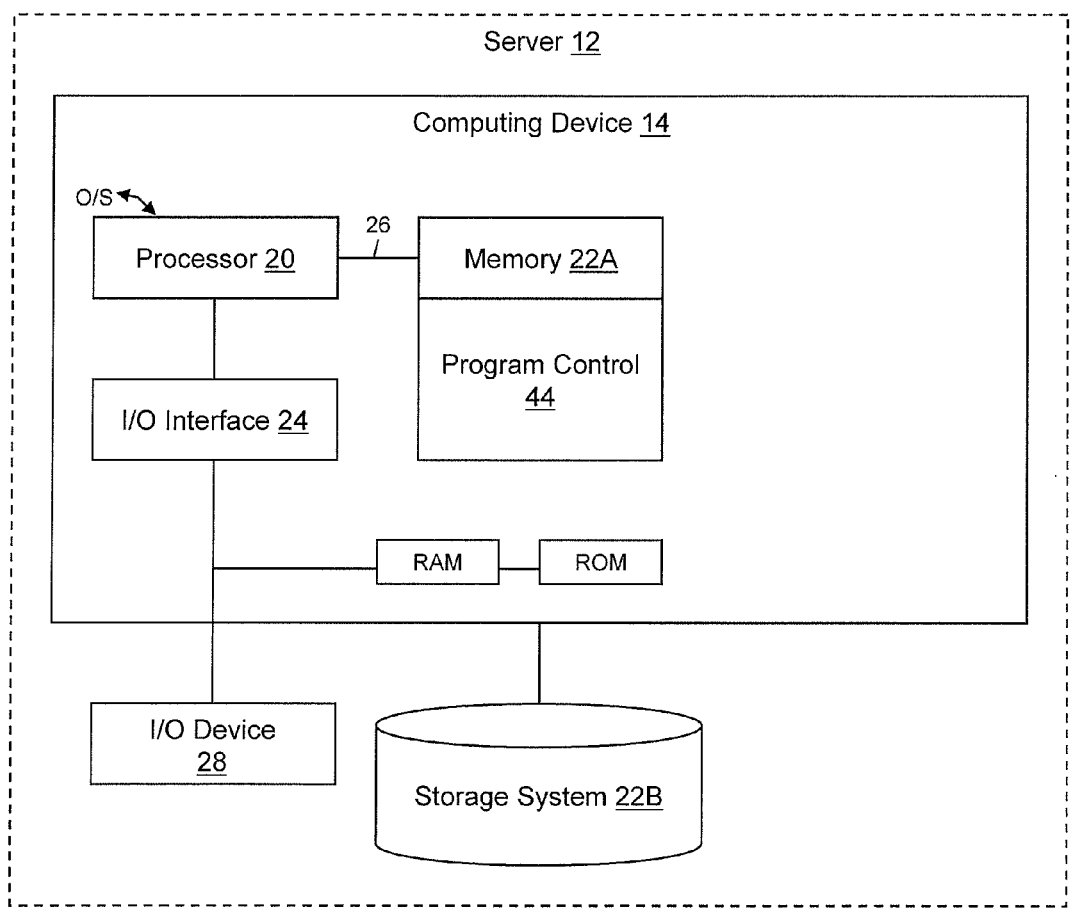
FIG. 2 shows an illustrative environment for implementing the steps in accordance with aspects of the invention.

As should be understood by those of ordinary skill, known capacitance values for different process variations can be stored in a storage device or database 22B, as shown in FIG. 2. Also, mask shapes and design offsets and process offsets for providing different target capacitance values associated with different process variations can be stored in the storage device or database 22B of FIG. 2. By having this information, it is possible to determine from a plurality of devices formed on a substrate (e.g., within chip, within reticle field, or within a wafer), a first amount of systematic capacitance variation from a target capacitance value. Once this is determined, it is possible to provide a modifying feature to a fixed actuator of the MEMS capacitor device in order to achieve a designed target capacitance value. This can be performed for many different locations within chip, within reticle field, or within a wafer.

More specifically, FIG. 2 shows an illustrative environment 10 for managing the processes in accordance with the invention. To this extent, the environment 10 includes a server or other computing system (e.g., server) 12 that can perform the processes described herein. The server 12 includes a computing device 14, which can be resident on a network infrastructure or computing device of a third party service provider (any of which is generally represented in FIG. 1). The computing device 14 includes a processor 20, memory 22A, an I/O interface 24, and a bus 26. The memory 22A can include local memory employed during actual execution of program code, bulk storage, and cache memories. In addition, the computing device includes random access memory (RAM), a read-only memory (ROM), and an operating system (O/S). The computing device 14 is in communication with the external I/O device/resource 28 and the storage system 22B. The I/O device 28 can comprise any device that enables an individual to interact with the computing device 14 (e.g., user interface) or any device that enables the computing device 14 to communicate with one or more other computing devices using any type of communications link. The processor 20 executes computer program code (e.g., program control 44), which can be stored in the memory 22A and/or storage system 22B. In accordance with aspects of the invention, the program control 44, e.g., the processes described herein, can be implemented as separate or combined modules, or as separate dedicated processors or a single or several processors to provide the functions of this tool.

Figure 3:
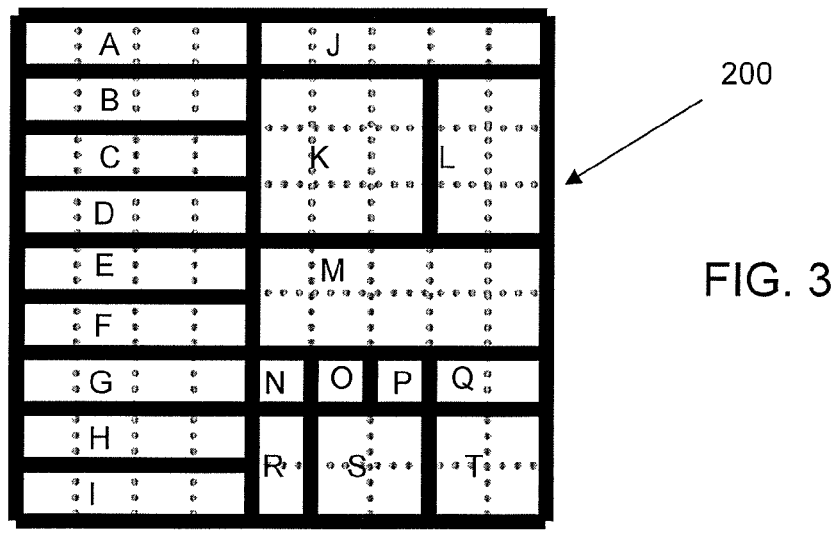
FIG. 3 shows an exemplary plurality of arrays within a chip in accordance with aspects of the present invention.

FIG. 3 shows an exemplary plurality of arrays within a chip in accordance with aspects of the present invention. More specifically, FIG. 3 shows a plurality of arrays within a chip 200. In FIG. 3, 20 addressable arrays are shown, labeled "A" to "T"; although any number of addressable arrays are contemplated by the present invention. It should be recognized by those of skill in the art that the addressable arrays can be of varying size, with each of the plurality of addressable arrays having one or more MEMS capacitor devices. In embodiments, 81 MEMS capacitor devices are provided in the addressable arrays; although this number is provided merely for illustrative purposes.

In embodiments, each of the MEMS capacitor devices are designed with nominal or design capacitance values of 0.1 pF, with a maximum design capacitance of 0.4 pF. The design capacitances referenced above is for illustrative purposes only and any capacitance values are contemplated by the present invention. In embodiments, the smallest fractional capacitance values are preferably provided in the smaller addressable arrays, e.g., array N, O and P, for example; whereas, the largest fractional capacitance values are provided in the larger arrays, e.g., A-I, for example. It should be understood by those of skill in the art that the fractional values and the location of the MEMS capacitor devices are provided for illustrative purposes, and should not be considered a limiting feature of the present invention. In embodiments, due to process variations, the MEMS capacitor devices tend to have smaller capacitance values at the edge of the chip 200. In this way, it should be understood by those of skill in the art that the capacitance values of the MEMS capacitor devices can vary more than the design values, due to process variations.

Figure 4A:
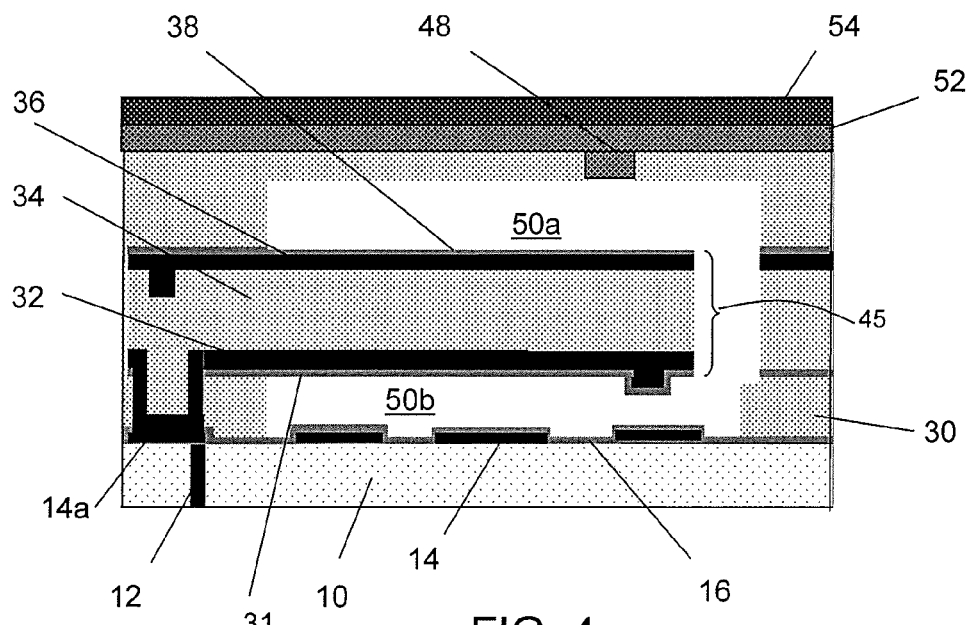
FIG. 4a shows an illustrative cross section of a MEMS capacitor device in accordance with aspects of the present invention.

FIG. 4a shows an illustrative cross sectional view of a MEMS capacitor device in accordance with aspects of the present invention. More specifically, the structure of FIG. 4a shows a MEMS beam 45 suspended between an upper cavity 50a and a lower cavity 50b, which is surrounded by an insulating material 30. In embodiments, the cavities can be formed by the removal of a sacrificial material, e.g., silicon or PMGI, through a vent hole 48. The removal process can be an etching process using, for example, $XeF_2$. The cavities can be hermetically sealed by sealing the vent hole 48 with a dielectric or conductive material 52. For example, in embodiments, a PECVD process can form a layer of dielectric material, e.g., oxide. In further embodiments, a nitride cap 54 can deposited on the dielectric material 52.

In more specific embodiments, the structure of FIG. 4a includes a substrate 10. The substrate 10, in embodiments, can be any layer of a device. In embodiments, the substrate 10 is an oxide or other insulator material known to those of skill in the art. As should be known to those of skill in the art, the substrate 10 can be implemented in either an SOI wafer or BULK implementation, or could be an insulating substrate such as sapphire or silica glass. An interconnect 12 is provided within the substrate 10. The interconnect 12 can be, for example, a tungsten or copper stud formed in a conventionally formed via. For example, the interconnect 12 can be formed using any conventional photolithographic, etching and deposition processes, known to those of skill in the art for forming studs.

A wiring layer is formed on the substrate 10 to form multiple wires 14 (e.g., one or more fixed electrodes of a MEMS structure) using conventional deposition and patterning processes. For example, a wiring layer can be deposited on the substrate to a depth of about 0.25 microns; although other dimensions are also contemplated by the present invention. Thereafter, the wiring layer is patterned to form the wires 14. At least one of the wires 14a is in contact (direct electrical contact) with the interconnect 12. In embodiments, the wires 14 can be formed from aluminum; although other wiring materials are also contemplated by the present invention. For example, the wires 14 can be a refractory metal such as Ti, TiN, TaN, Ta, and W, or AlCu, AlCuSi, amongst other wiring materials. An optional insulator material 16 is formed on the multiple wires 14 and exposed portions of the substrate 10. In embodiments, the insulator material 16 is an oxide, deposited using conventional CVD processes.

Still referring to FIG. 4a, to form the MEMS beam 45, several materials are deposited and patterned using conventional CMOS processes, e.g., photolithographic and etching (RIB). For example, an insulator material (e.g., oxide) 31 can be deposited on a sacrificial material. The deposition can be, for example, a conventional conformal deposition process, e.g., chemical vapor deposition (CVD). An electrode 32 is formed over the insulator material 31. The electrode 32 can be, for example, AlCu or AlCuSi; although other materials are also contemplated by the invention. In embodiments, for example, the electrode 32 can be a TiN, TaN, Ta or W, amongst other materials. The thicknesses of this and other electrodes and/or wires can vary depending on the specific design parameters. An insulator material 34 is formed on the electrode 32. In embodiments, the insulator material 34 is a PECVD TEOS (oxide).

Still referring to FIG. 4a, an upper electrode 36 is formed over the insulator material 34. In embodiments, the upper electrode 36 can be, for example, AlCu; although other materials are contemplated by the invention as discussed above. In embodiments, for example, the upper electrode 36 can be TiN, TaN, Ta, or W, amongst other materials, and should be a thickness which balances the overall volume of the device, and hence not place undue stresses on the beams of the MEMS structures. In other words, the thickness of the electrode 36 should be the same or substantially the same as the thickness of the electrode 32. An optional insulator material (capacitor oxide) 38 is deposited on the electrode 34.

Figure 4B:
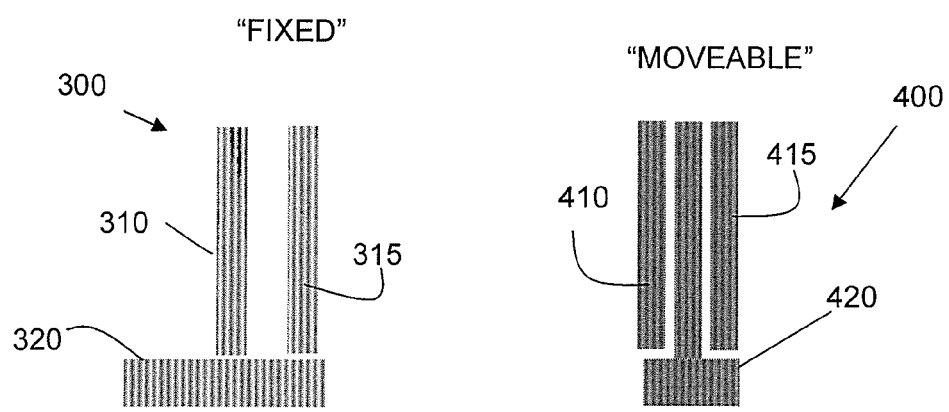
FIG. 4b shows an illustrative top view of a MEMS capacitor device in accordance with aspects of the present invention.

FIG. 4b shows an illustrative top view of a MEMS capacitor device in accordance with aspects of the present invention. More specifically, FIG. 4b shows an illustrative top view of a MEMS capacitor device, with a fixed actuator and a moving electrode. More specifically, the fixed electrode 300 includes fixed actuators 310 and 315, and a capacitor area 320. As shown, the fixed actuators 310 and 315 can include several different layouts such as, for example, slotted, cheesed, solid or other desired layouts. Similarly, the moveable electrode 400 includes moveable actuators 410 and 415, with a capacitor area 420. The movable electrode 400 is composed of patterned metals, such as the actuators and capacitor area 410, 415, and 420, which are embedded in a dielectric beam, as known in the art.

Figure 4C:
FIG. 4c shows a representative lower, fixed actuator and moveable actuator of a MEMS capacitor device at different locations.

FIG. 4c shows a representative top view of a lower, fixed actuator and moveable actuator of a MEMS capacitor device at different locations. More specifically, FIG. 4c is provided to illustrate a conventionally positioned and shaped lower fixed electrode (300) and moveable capacitor electrode (400) at two locations on the wafer: location 1 and location 2, where the capacitor head areas are nominally the same. For example, location 1 can be a location in an edge of a wafer; whereas, location 2 can be a middle location of the wafer. Although FIG. 4c shows two locations, it should be understood by those of skill in the art that FIG. 4c can equally be representative of any location on a wafer, as well as any location within a chip and/or reticle field. As should be understood by those of skill in the art and as described herein, the process variations along the edge and middle of the wafer will result in different capacitance values, which may exceed a designed delta capacitance value where the delta capacitance is the difference between the actuated and non-actuated capacitance values. However, FIG. 4b does not account for the process variations, when forming the lower fixed actuator and moveable actuator. As such, the capacitance values of the MEMS capacitor device can be outside of design parameters.

Figure 5:
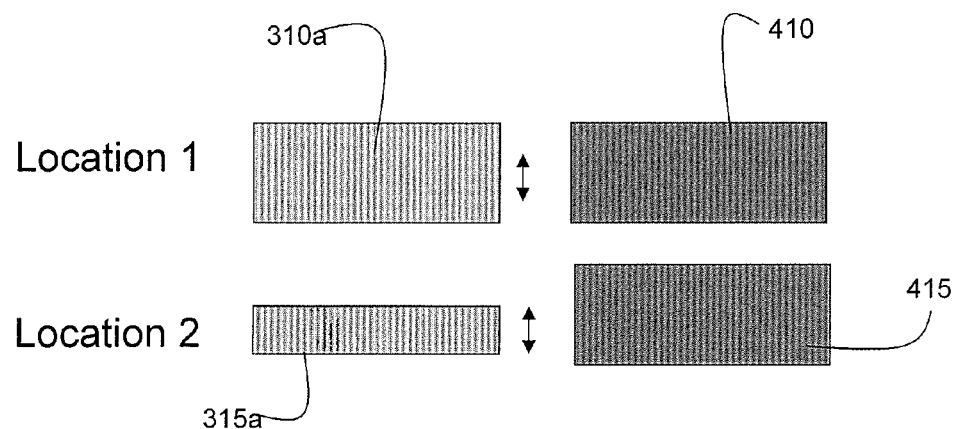
FIG. 5 shows a compensation scheme of a MEMS capacitor device in accordance with aspects of the present invention.

FIG. 5 shows a compensation scheme of the MEMS capacitor device formed on a substrate, comparing the layout to FIG. 4c. As discussed in more detail below, the layout of FIG. 5 can be representative of a wafer, a reticle field or a chip. In this comparison, the capacitance density, i.e., per unit area, of location 1 is less than location 2, due to process variability such as increased metal hillocks on the capacitor plates, which decrease the contact area and capacitance; or increased MEMS beam curvature, which decreases the contact area and capacitance. Comparing the layout to FIG. 4c, the lower fixed actuators 310a and 315a are printed narrower at location 2, in order to adjust (e.g., lower) its overall capacitance values due to process variations at different locations on the substrate. This will result in a decreased capacitor area for location 2 but, since location 2 has higher capacitance density than location 1, the capacitance of locations 1 and 2 will be the same.

It should be understood by those of skill in the art that the lower fixed actuators 310a and 315a can also be printed with other dimensions, depending on the location, e.g., on a chip, reticle field and/or wafer, and respective process variations which may be identified by the computer infrastructure shown in FIG. 2. Accordingly, by implementing the processes of the present invention, it is possible to modify the surface area of the lower fixed capacitor head 320 to adjust for process variations at different locations within, e.g., a wafer, reticle field or chip. Also, although a simple lower capacitor plate 320 area change is shown, in practice there could be slots or holes in the lower capacitor plate and these slots or holes could be printed larger or smaller to increase or decrease the capacitance, respectively, as described in FIG. 7.

By way of a specific example, FIG. 5 can be representative of a compensation scheme of the MEMS capacitor device within a wafer; although, FIG. 5 can equally be applicable for a compensation scheme within a chip (any of which is representative of a MEMS capacitor device formed on a substrate). By way of illustration, as the MEMS capacitor device would normally have a lower capacitance along an edge of a wafer (due to process variations), the present invention prints a wider lower fixed actuator 315a to adjust for the process variations (e.g., adjust the capacitance value). Similarly, the lower fixed actuator 310a can also be printed narrower or wider (compared to the electrode shown in FIG. 4c) to adjust for MEMS beam pull-in voltage variability. It should also be understood by those of skill in the art, that the lower fixed actuators 310a, 315a can be printed with other dimensions, depending on the location and process variations, as can be identified by the computer infrastructure of FIG. 2.

As another example, FIG. 5 is representative of a device within the reticle field or chip. In this specific example, the present invention provides an intentional design offset in the electrode region to systematically vary the coincident electrode area (of the lower fixed capacitor head 320). That is, the design offset provides different shapes and/or sizes of the lower fixed capacitor head 320 at various locations of reticle field or chip, based on identified process variations of the MEMS capacitor device. In embodiments, the design offset can be accomplished by modifying a mask in order to form wider or narrower lower fixed actuators 310a, 315a, at different locations within the reticle field or chip. In this way, capacitance values can be modified. In embodiments, the moveable capacitor actuators 410 and 415 will not be adjusted, to ensure that the overall shape and volume of these actuators 410 and 415 remain the same.

In another specific example, FIG. 5 may be representative of a chip design. In the chip design, the lower fixed capacitor heads 320 can be modified by an intentional design offset, where a lower fixed capacitor head 320 along an edge of the chip may be designed wider on the lithographic mask. This is due to the fact that identified process variations typically provide lower capacitance values along an edge of the chip.

Also, FIG. 5 may be representative of a process offset. In this scenario, an intentional process offset is provided in the electrode areas to systematically vary the coincident electrode area across the wafer, reticle field and/or chip. For example, processes may be adjusted in order to adjust the capacitance values, e.g., a change of dose or deposition rate of insulator and/or metal material, or change of CMP processes.

Figure 6:
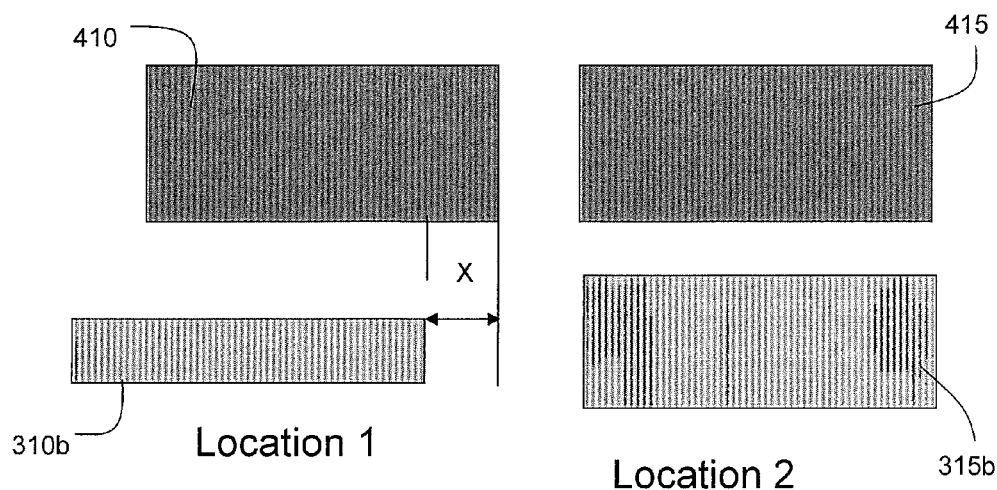
FIG. 6 shows a compensation scheme of a MEMS capacitor device in accordance with aspects of the present invention.

FIG. 6 shows a compensation scheme of a MEMS capacitor device in accordance with aspects of the present invention. More specifically, FIG. 6 shows the lower fixed actuator 310*b* being offset with respect to the moveable capacitor electrodes 410. As shown in FIG. 6, the MEMS capacitor device at location 1 may be provided with an offset "X", to adjust for process variations that would otherwise provide a higher than designed capacitance value. Thus, by providing an offset "X" to the lower fixed actuator 310*b*, it is possible to achieve a lower capacitance value, i.e., to have less surface area between the capacitors. The offset can vary depending on the location of the MEMS capacitor device. As noted above, the process variations and respective capacitance values can be identified by the computer infrastructure shown in FIG. 2, which can then make the appropriate adjustments based on historical values.

Figure 7:
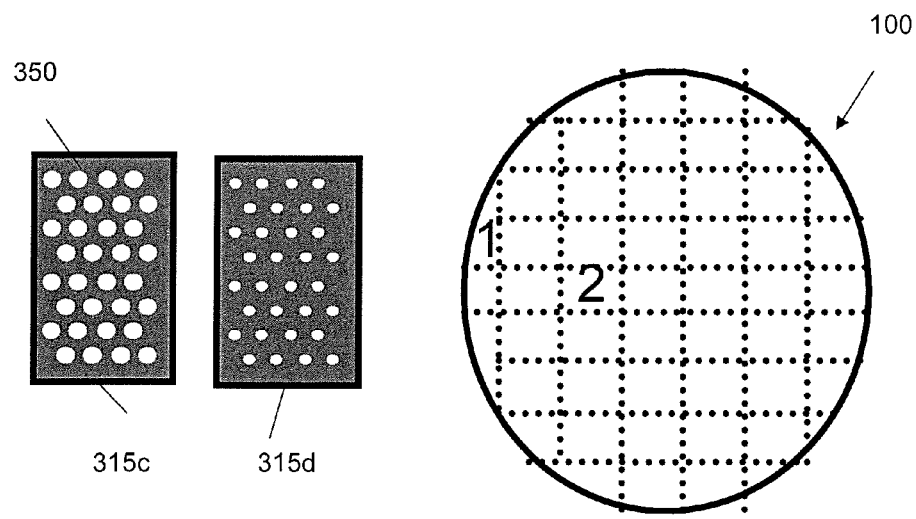
FIG. 7 shows a MEMS capacitor device with capacitor plates of varying volume in accordance with aspects of the present invention.

FIG. 7 shows a MEMS capacitor device with fixed capacitor plates of varying volume in accordance with aspects of the present invention. More specifically, FIG. 7 shows capacitor plates 315*c* and 315*d* at different locations of the wafer 100, as represented by location 1 and location 2. More specifically, FIG. 7 shows capacitor plates with holes or slots 350 of different sizes or densities with respect to the location of the capacitor plate as printed on the wafer 100. In embodiments, for example, the capacitor plate layout with holes or slots 350 can occupy 20% of the area and can be varied in size (or shape) or number of holes or slots 350 such that the total capacitor plate area can be varied by about +/−4%. In embodiments, the capacitor area can be reduced at the extreme wafer edge (location 1) by photolithographic overexposing; whereas, in the mid region of the wafer (location 2), the capacitor area can be increased by photolithographic underexposing. In further embodiments, the capacitor area can be adjusted by using different masks, for capacitor plates at different locations on the wafer 100. For example, a mask with more holes or slots can be used on the extreme wafer edge to reduce capacitance values of the capacitor plate.

Figure 8:
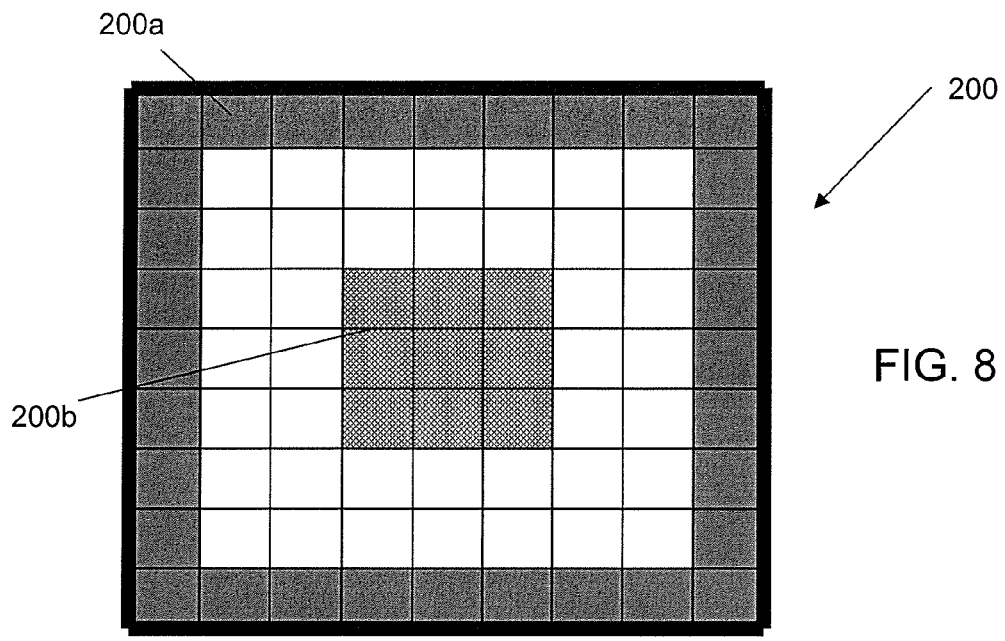
FIG. 8 shows MEMS capacitor devices formed at different locations on a chip in accordance with aspects of the present invention.

FIG. 8 shows MEMS capacitor devices formed at different locations on a chip in accordance with aspects of the present invention. More specifically, FIG. 8 shows an extreme edge 200*a* of the chip 200 with an increased fixed capacitor plate area by about, e.g., 3%, to eliminate lower capacitance on dicing channel edge (layout change); whereas, a center portion 200*b* of the chip 200 shows a decrease fixed capacitor plate area by about, e.g., 2% to eliminate lower capacitance due to within beam variation resulting from chemical mechanical polishing (CMP). These increased or decreased fixed capacitor plate areas are set by design, i.e., by the dimensions on the lithographic mask, and not by process variation, i.e., under or over exposing the printing of the fixed capacitor plate lithographic mask.

Figure 9:
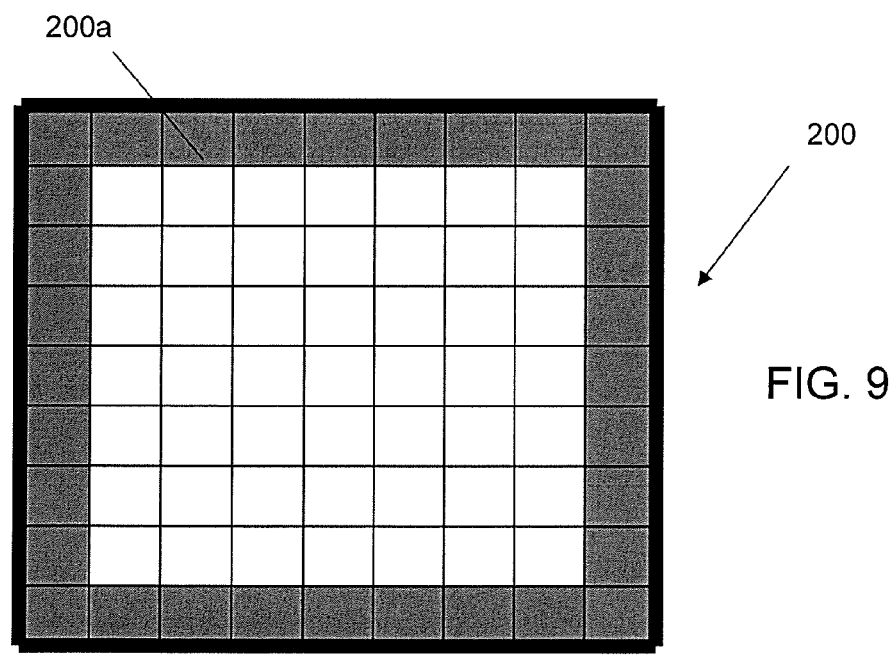
FIG. 9 shows MEMS capacitor devices formed at different locations on a wafer in accordance with aspects of the present invention.

FIG. 9 shows MEMS capacitor devices formed at different locations on a chip in accordance with aspects of the present invention. More specifically, the present invention shows an increase capacitor plate area on the lithographic mask by about, e.g., 3%, to eliminate lower capacitance on wider dicing channel edge at an edge 200*a* of a reticle field 200 (layout change). As in all of the embodiments, these adjustments can be provided by identifying (determining) a process variation and related target value which can be achieved.

In embodiments, the size of the fixed wires are varied to change the capacitance because varying the size of the wires in the MEMS beam may result in a change in MEMS beam pull-in voltage or other electrical properties. Although the present invention focuses on changing the fixed wire dimensions, the MEMS beam wire dimensions could also be varied, either by themselves or in combination with varying the fixed wires. Also, although the present invention focuses on changing the capacitance value of the MEMS, the MEMS actuators could also be made larger or smaller to tune the pull-in voltage, which is partially determined by the MEMS actuator area.

Figure 10:
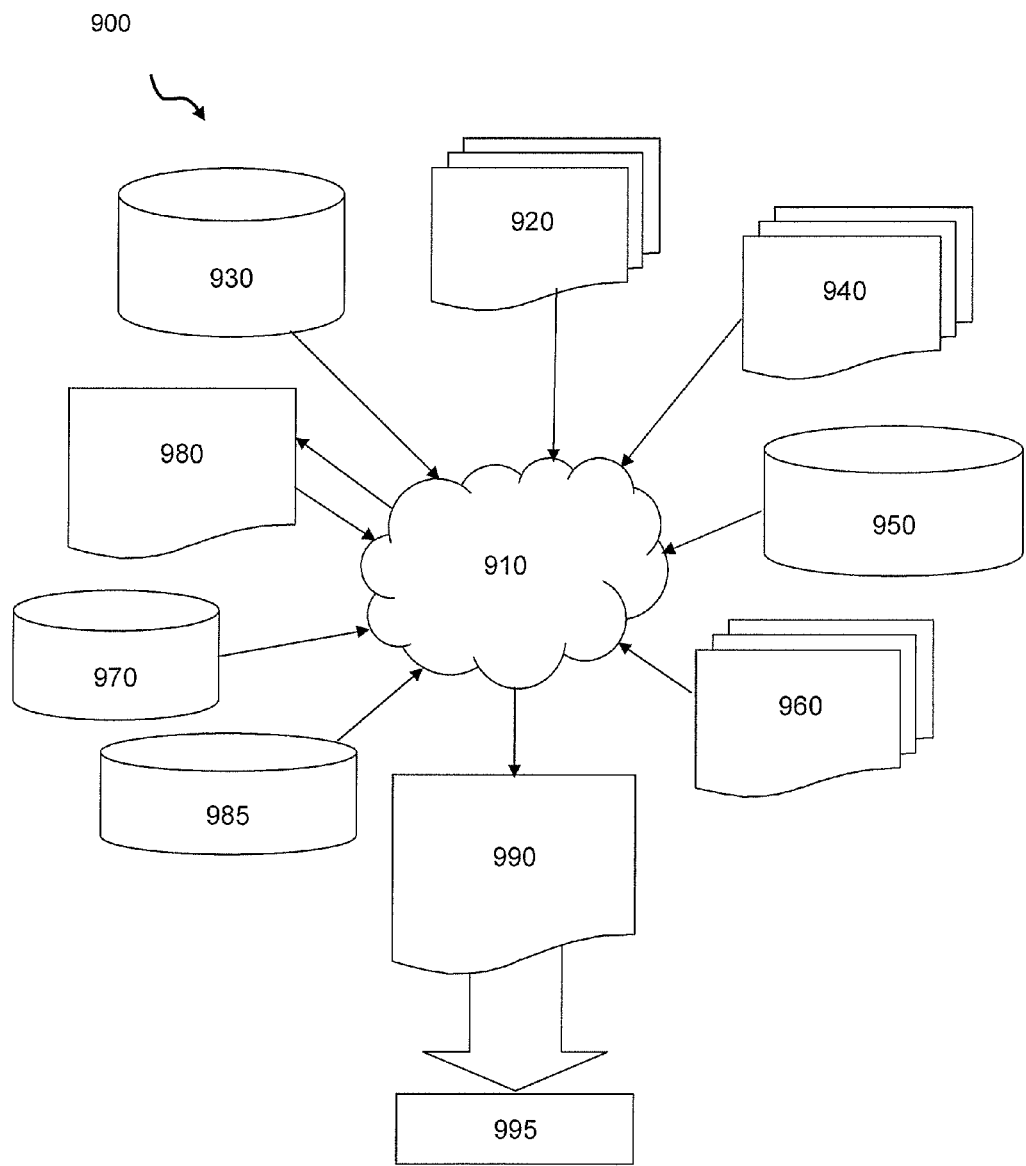
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4*a*, 4*b* and 4*c*-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: photolithographic machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4*a*, 4*b* and 4*c*-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4a, 4b and 4c-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4a, 4b and 4c-9. In one embodiment, design structure 990 may comprise a compiled, executable HDL simulation model that functionally simulates the devices shown in FIGS. 1-4a, 4b and 4c-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4a, 4b and 4c-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
  identifying a process variation related to a formation of micro-electro-mechanical structure (MEMS) capacitor devices across a substrate; and
  providing design offsets or process offsets in electrode areas of the MEMS capacitor devices across the substrate, based on the identified process variation, using a computing device.

2. The method of claim 1, wherein the design offsets or process offsets comprise adjusting capacitance values of the MEMS capacitor devices across the substrate.

3. The method of claim 2, wherein the capacitance values of the MEMS capacitor devices are changed based on different identified process variations at different locations of the substrate.

4. The method of claim 1, wherein the design offsets comprise providing a mask design, which varies by design based on locations of the MEMS capacitor devices across at least one of a wafer, a reticle field and a chip.

5. The method of claim 4, wherein the mask design provides a narrower fixed actuator of the MEMS capacitor devices at an edge of a reticle field or chip than towards a center.

6. The method of claim 1, wherein the design offsets comprise offsetting a location of a fixed actuator of the MEMS capacitor devices with respect to a moveable actuator.

7. The method of claim 1, wherein the identifying a process variation is based on historical information stored in a storage device.

8. The method of claim 1, wherein the providing design offsets or process offsets in electrode areas comprises comparing the identified process variation to target capacitance values and making adjustments to physical characteristics of the MEMS capacitor devices to achieve the target capacitance values at various locations across the substrate.

9. The method of claim 1, wherein the design offsets or the process offsets comprise varying a volume of capacitor plates of the MEMS capacitor devices across at least one of a wafer, a reticle field and a chip.

10. The method of claim 9, wherein the varying a volume of the capacitor plates comprises adjusting a dimension or amount of slots or holes in the capacitor plates.

11. The method of claim 10, wherein the volume of the capacitor plates is varied through process offsets such that capacitor area can be adjusted at a wafer edge by photolithographic overexposing and in a mid region by photolithographic underexposing.

12. The method of claim 10, wherein the volume of the capacitor plates is varied through design offset by providing a different mask for different locations on a wafer.

13. The method of claim 1, wherein the design offsets or the process offsets comprise increasing capacitor plate area at an edge of a chip.

14. The method of claim 13, wherein the design offsets or the process offsets comprise decreasing capacitor plate area at a center portion of the chip.

15. The method of claim 1, wherein the design offsets or the process offsets comprise increasing capacitor plate area to eliminate lower capacitance on a wider dicing channel edge at an edge of a reticle field.

16. A method, comprising:
identifying a first amount of a systematic capacitance variation from a target capacitance value for a plurality of first capacitors on a substrate; and
modifying a feature of at least some of the first capacitors to adjust a capacitance value of the at least some of the first capacitors at different locations on the substrate.

17. The method of claim 16, wherein the modifying comprises one of:
an offset of a fixed actuator with respect to a moveable actuator of the plurality of first capacitors, and
a different size of the fixed actuator, compared to an original design, based on a location of the fixed actuator.

18. The method of claim 16, wherein the modifying comprises providing a design offset or a process offset for the at least some of the first capacitors.

19. The method of claim 16, further comprising identifying a second amount of a systematic capacitance variation from a target capacitance value for a plurality of second capacitors on the substrate and modifying a feature of at least some of the second capacitors to adjust a capacitance value based on their locations on the substrate.

20. The method of claim 16, wherein the identifying comprises identifying a systematic capacitance variation within a chip, within a reticle field, or within a wafer.

21. The method of claim 16, wherein the modifying comprises changing a capacitor plate area of each of the least some of the first capacitors.

22. A structure comprising:
a first set of micro-electro-mechanical structure (MEMS) capacitor devices having a first adjusted capacitance value based on identified process variations at a first location on a substrate; and
a second set of MEMS capacitor devices having a second adjusted capacitance value based on identified process variations at a second location on the substrate, wherein
the first adjusted capacitance value and the second adjusted capacitance value are different as a result of a difference in a physical characteristic feature of the first set of MEMS capacitor devices and the second set of MEMS capacitor devices.

23. A method in a computer-aided design system for generating a functional design model of a plurality of micro-electric-mechanical structure (MEMS) capacitor devices, the method comprising:
generating a functional representation of a first set of MEMS capacitor devices having a first adjusted capacitance value based on process variations at a first location on a substrate; and
generating a functional representation of a second set of MEMS capacitor devices having a second adjusted capacitance value based on process variations at a second location on the substrate, wherein
the first adjusted capacitance value and the second adjusted capacitance value are different as a result of a physical characteristic feature of the first set of MEMS capacitor devices and the second set of MEMS capacitor devices.

* * * * *